(12) United States Patent
Kasai

(10) Patent No.: US 9,985,073 B2
(45) Date of Patent: *May 29, 2018

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventor: Hiroki Kasai, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/616,979

(22) Filed: Jun. 8, 2017

(65) Prior Publication Data

US 2017/0271396 A1 Sep. 21, 2017

Related U.S. Application Data

(63) Continuation of application No. 15/273,139, filed on Sep. 22, 2016, now Pat. No. 9,704,912.

(30) Foreign Application Priority Data

Sep. 24, 2015 (JP) .................................. 2015-187014

(51) Int. Cl.
*H01L 31/119* (2006.01)
*H01L 27/146* (2006.01)
(Continued)

(52) U.S. Cl.
CPC .......... *H01L 27/14658* (2013.01); *G01T 1/24* (2013.01); *H01L 27/14659* (2013.01);
(Continued)

(58) Field of Classification Search
CPC ......... H01L 27/14658; H01L 27/14659; H01L 31/02005; H01L 31/022408; H01L 31/085; H01L 31/119
See application file for complete search history.

(56) References Cited

U.S. PATENT DOCUMENTS 7,682,883 B2 3/2010 Cho et al.
9,356,163 B1 5/2016 Liu et al.
(Continued)

FOREIGN PATENT DOCUMENTS

JP 2014-135454 7/2014

*Primary Examiner* — Stephen W Smoot
(74) *Attorney, Agent, or Firm* — Volentine, Whitt & Francos, PLLC

(57) ABSTRACT

A semiconductor device including: a first semiconductor layer including a first region and a second region adjacent to the first region; a first insulator layer provided above the first semiconductor layer; an intermediate semiconductor layer, having an n-type conduction, provided above the first region of the first semiconductor layer and above the first insulator layer; a second insulator layer provided above the intermediate semiconductor layer; a second semiconductor layer provided above the first region of the first semiconductor layer and above the second insulator layer; a sensor formed in the second region of the first semiconductor layer; a contact electrode connected to the intermediate semiconductor layer; and a circuit element formed in the second semiconductor layer.

6 Claims, 13 Drawing Sheets

(51) Int. Cl.
*G01T 1/24* (2006.01)
*H01L 31/0224* (2006.01)
*H01L 31/08* (2006.01)
*H01L 31/02* (2006.01)

(52) U.S. Cl.
CPC .............. *H01L 31/02005* (2013.01); *H01L 31/022408* (2013.01); *H01L 31/085* (2013.01); *H01L 31/119* (2013.01)

(56) References Cited

U.S. PATENT DOCUMENTS

| | | |
|---|---|---|
| 9,362,444 B1 | 7/2016 | Leobandung et al. |
| 9,704,912 B2 * | 7/2017 | Kasai ..................... G01T 1/24 |
| 2012/0049076 A1 | 3/2012 | Tredwell |
| 2013/0043537 A1 | 2/2013 | Arai et al. |
| 2013/0120951 A1 | 5/2013 | Zuo et al. |
| 2014/0225209 A1 | 8/2014 | Kasai |
| 2016/0172396 A1 | 6/2016 | Masuda |

* cited by examiner

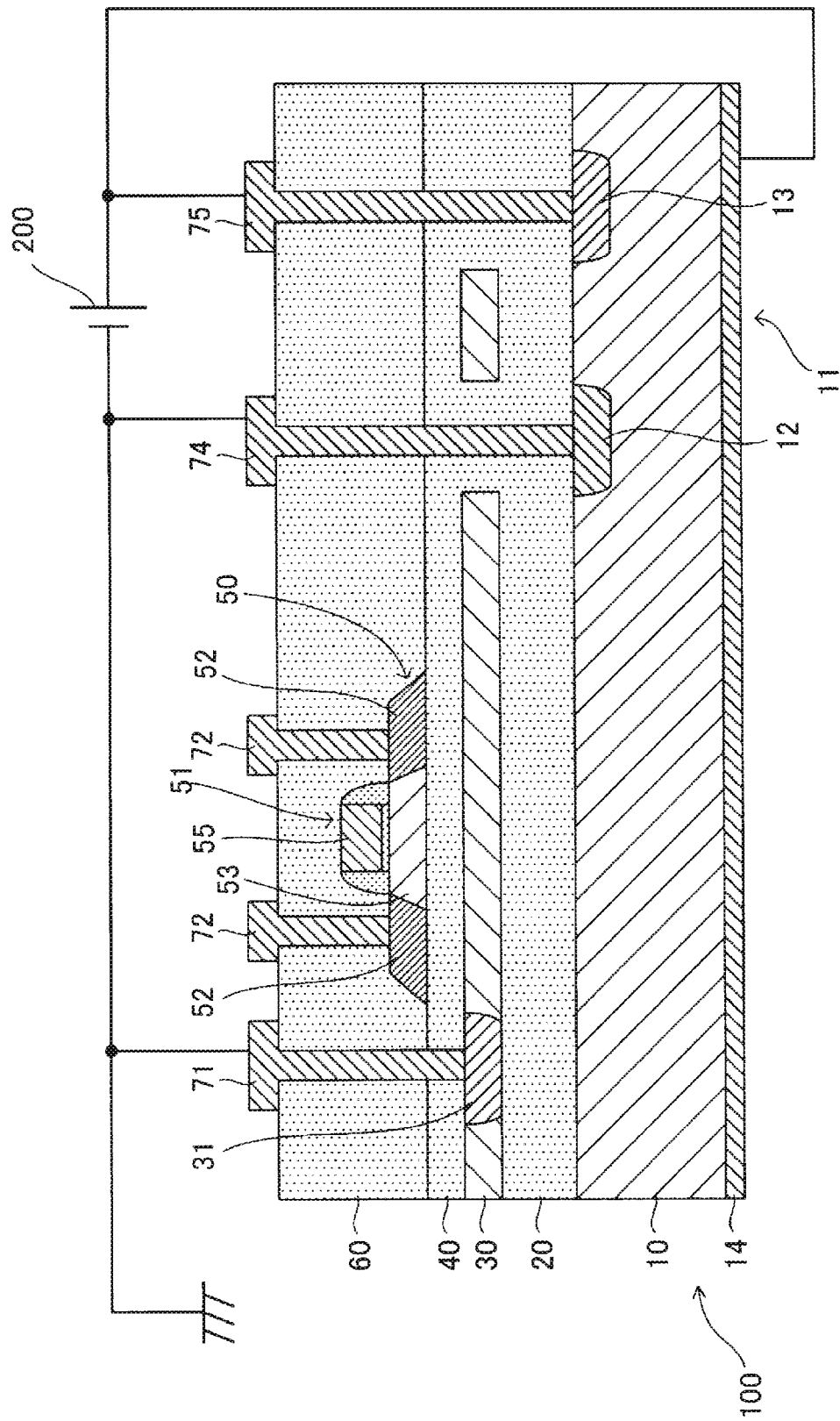

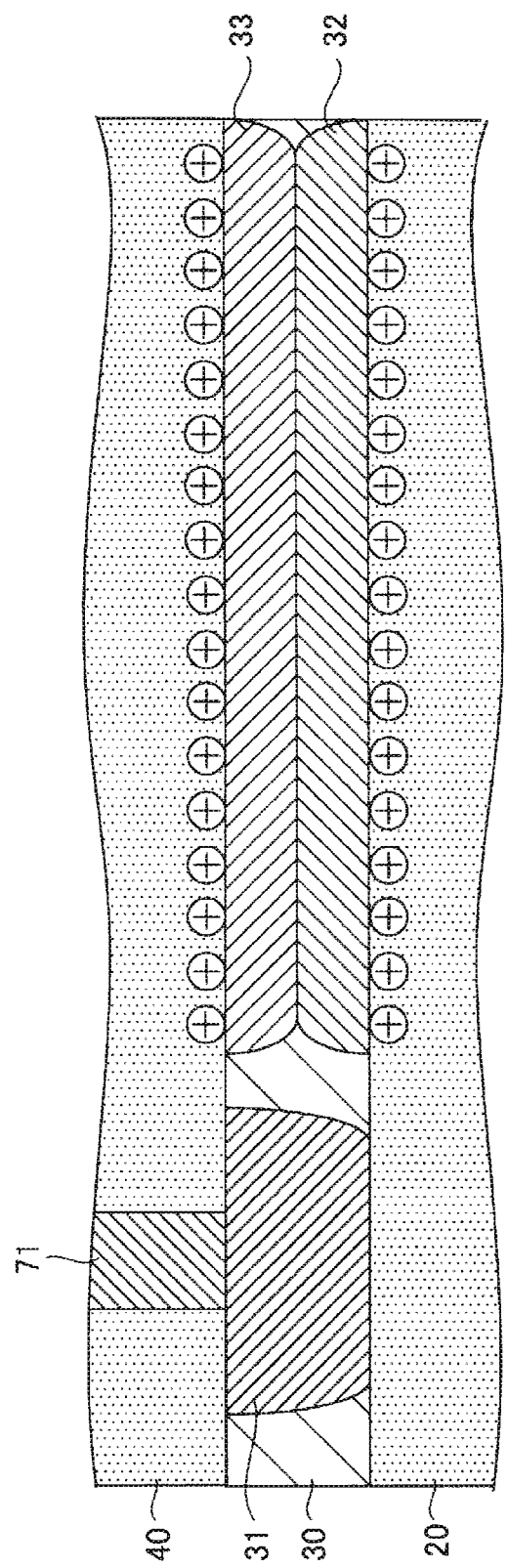

SEMICONDUCTOR DEVICE AND SEMICONDUCTOR DEVICE MANUFACTURING METHOD

CROSS-REFERENCE TO RELATED APPLICATION

This application is a continuation application of application Ser. No. 15/273,139, filed on Sep. 22, 2016, now U.S. Pat. No. 9,704,912 issued on Jul. 11, 2017. This application claims priority under 35 USC 119 from Japanese Patent Application No. 2015-187014, filed on Sep. 24, 2015, the disclosure of which is incorporated by reference herein.

BACKGROUND

Technical Field

The present disclosure relates to a semiconductor device and a semiconductor device manufacturing method.

Related Art

Semiconductor devices in which a semiconductor layer formed with a sensor, and a semiconductor layer formed with a peripheral circuit, are stacked on the same semiconductor substrate with an insulator film interposed therebetween, are known.

Japanese Patent Application Laid-Open (JP-A) No. 2014-135454, for example, describes a semiconductor device including: a photodiode having an n-type second semiconductor layer and a p-type semiconductor region provided above a main face of the second semiconductor layer; a first semiconductor layer provided above the second semiconductor layer and formed with a transistor; a p-type third semiconductor layer provided between the first semiconductor layer and the second semiconductor layer and applied with ground potential; a first insulator layer provided between the first semiconductor layer and the third semiconductor layer; and a second insulator layer provided between the second semiconductor layer and the third semiconductor layer.

JP-A No. 2014-135454 describes how, by fixing the p-type third semiconductor layer to a ground potential, high voltage applied to the second semiconductor layer does not reach the first semiconductor layer, even in a case in which a high voltage is applied to the second semiconductor layer, in order to deplete the second semiconductor layer.

In the semiconductor device described in JP-A No. 2014-135454, when the third semiconductor layer is exposed to a plasma in a manufacturing process using plasma, such as etching or CVD, static charges charged in the vicinity of a boundary between the third semiconductor layer and the first insulator layer, and charged in the vicinity of a boundary between the third semiconductor layer and the second insulator layer, retain. Inversion layers are thereby formed inside the third semiconductor layer, at the first insulator layer side and at the second insulator layer side, respectively. In a case in which n-type inversion layers are formed in the third semiconductor layer configured by a p-type semiconductor, the entire third semiconductor layer cannot be fixed to a potential, even in a case in which the third semiconductor layer is applied with the desired potential, and the third semiconductor layer enters an electrically floating state. Thus, in the semiconductor device described in JP-A No. 2014-135454, there may be cases that the third semiconductor layer cannot be fixed to a desired potential, due to inversion layers occurring inside the third semiconductor layer originating from positive charges charged at the periphery of the third semiconductor layer. In a case in which capacitive coupling occurs between the third semiconductor layer in the floating state and the second semiconductor layer applied with a high voltage, a non-illustrated unintentional potential, corresponding to the high voltage applied to the second semiconductor layer, is applied to the third semiconductor layer, and a transistor formed in the first semiconductor layer may erroneously operate due to this influence.

SUMMARY

The present disclosure provides a semiconductor device and a semiconductor device manufacturing method that may fix an intermediate semiconductor layer to a desired potential, even in cases in which, in semiconductor devices including an intermediate semiconductor layer sandwiched in insulator layers between a semiconductor layer formed with a circuit element and a semiconductor layer formed with a sensor, positive charges are charged at the periphery of the intermediate semiconductor layer.

A first aspect of the present disclosure is a semiconductor device, including: a first semiconductor layer including a first region and a second region adjacent to the first region; a first insulator layer provided above the first semiconductor layer; an intermediate semiconductor layer, having an n-type conduction, provided above the first region of the first semiconductor layer and above the first insulator layer; a second insulator layer provided above the intermediate semiconductor layer; a second semiconductor layer provided above the first region of the first semiconductor layer and above the second insulator layer; a sensor formed in the second region of the first semiconductor layer; a contact electrode connected to the intermediate semiconductor layer; and a circuit element formed in the second semiconductor layer.

A second aspect of the present disclosure is a semiconductor device, including: a first semiconductor layer including a first region and a second region adjacent to the first region; a first insulator layer provided above the first semiconductor layer; an intermediate semiconductor layer, having a p-type conduction, provided above the first region of the first semiconductor layer and above the first insulator layer; a second insulator layer provided above the intermediate semiconductor layer; a second semiconductor layer provided above the first region of the first semiconductor layer and above the second insulator layer; a sensor formed in the second region of the first semiconductor layer; a contact electrode connected to the intermediate semiconductor layer; and a circuit element formed in the second semiconductor layer, wherein the intermediate semiconductor layer has a thickness such that a first inversion layer formed at a first insulator layer side of the intermediate semiconductor layer due to positive charges retained at the vicinity of a boundary between the intermediate semiconductor layer and the first insulator layer, and a second inversion layer formed at the second insulator layer side of the intermediate semiconductor layer due to positive charges retained at the vicinity of a boundary between the intermediate semiconductor layer and the second insulator layer, are not contiguous to each other.

A third aspect of the present disclosure is a semiconductor device, including: a first semiconductor layer including a first region and a second region adjacent to the first region; a first insulator layer provided above the first semiconductor layer; an intermediate semiconductor layer provided above the first region of the first semiconductor layer and above the first insulator layer; a second insulator layer provided above the intermediate semiconductor layer; a second semiconductor layer provided above the first region of the first semiconductor layer and above the second insulator layer; a sensor formed in the second region of the first semiconductor layer; a first contact region, having a p-type conduction, formed above the intermediate semiconductor layer, and a second contact region, having an n-type conduction, electrically connected to the first contact region; a contact electrode connected to the first contact region and to the second contact region; and a circuit element formed in the second semiconductor layer.

A fourth aspect of the present disclosure is a semiconductor device manufacturing method, including: preparing a semiconductor substrate that includes a first semiconductor layer including a first region and a second region adjacent to the first region, a first insulator layer provided above the first semiconductor layer, an intermediate semiconductor layer provided above the first region of the first semiconductor layer and above the first insulator layer, a second insulator layer provided above the intermediate semiconductor layer, and a second semiconductor layer provided above the first region of the first semiconductor layer and above the second insulator layer; forming a circuit element in the second semiconductor layer; forming a sensor in the second region of the first semiconductor layer; forming a first contact region having a p-type conduction and a second contact region having an n-type conduction in the intermediate semiconductor layer; and forming a contact electrode that is connected to the first contact region and the second contact region.

The present disclosure provides a semiconductor device and a manufacturing method that may fix the intermediate semiconductor layer to a desired potential, even in cases in which, in semiconductor devices including an intermediate semiconductor layer sandwiched in insulator layers between the semiconductor layer formed with the circuit element and the semiconductor layer formed with the sensor, positive charges are charged at the periphery of the intermediate semiconductor layer.

BRIEF DESCRIPTION OF THE DRAWINGS

Exemplary embodiments will be described in detail based on the following figures, wherein:

FIG. 1 is a cross-sectional view illustrating configuration of a semiconductor device according to an exemplary embodiment of the present disclosure;

FIG. 5 is a cross-sectional view illustrating a state inside an intermediate semiconductor layer in a case in which the intermediate semiconductor layer is configured by a p-type semiconductor;

DETAILED DESCRIPTION

Figure 2A:
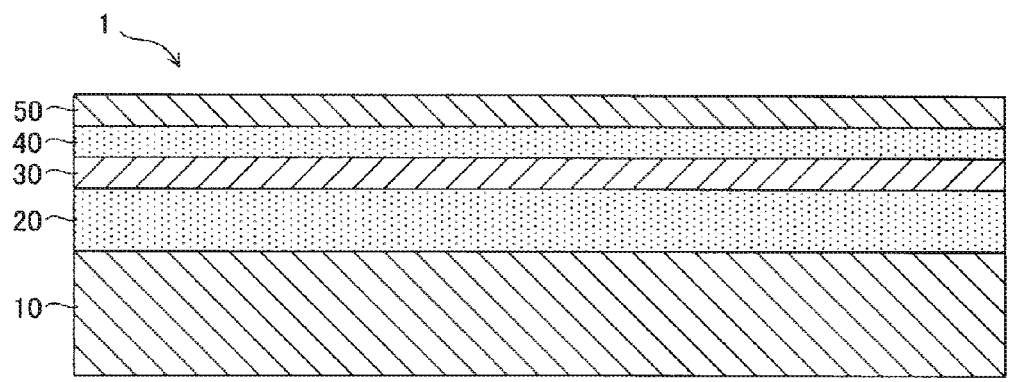
FIG. 2A is a cross-sectional view illustrating a manufacturing method of a semiconductor device according to an exemplary embodiment of the present disclosure.

Explanation follows regarding examples of exemplary embodiments of the present disclosure, with reference to the drawings. Note that in each of the drawings, the same or equivalent configuration elements and portions are appended with the same reference numerals, and duplicate explanation thereof is omitted if appropriate.

First Exemplary Embodiment

FIG. 1 is a cross-sectional view illustrating a configuration of a semiconductor device 100 according to an exemplary embodiment of the present disclosure. The semiconductor device 100 is configured including a photodiode 11 configuring an X-ray sensor and a transistor 51 serving as a circuit element configuring a peripheral circuit. The photodiode 11 is formed by a Double-Silicon On Insulator (Double-SOI) substrate in which a first semiconductor layer 10 configured by an n-type semiconductor, a first insulator layer 20, an intermediate semiconductor layer 30 configured by an n-type semiconductor, a second insulator layer 40, and a second semiconductor layer 50 configured by a p-type semiconductor, are stacked in this sequence.

The photodiode 11 includes an anode 12 configured by a high concentration p-type semiconductor and a cathode 13 configured by a high concentration n-type semiconductor, that are disposed separately from each other on a front face of the first semiconductor layer 10 configured by low concentration n-type silicon. The photodiode 11 also includes an anode electrode 74 connected to the anode 12, a cathode electrode 75 connected to the cathode 13, and a back face electrode 14 formed on a back face of the first semiconductor layer 10.

Circuit elements including the transistor 51 are disposed at positions of the second semiconductor layer 50 that do not overlap with the photodiode 11. Namely, the first semiconductor layer 10 includes a first region and a second region that is adjacent to the first region. The photodiode 11 is provided in the second region of the first semiconductor layer 10, and the circuit elements including the transistor 51 are provided above the first region of the first semiconductor layer 10. The transistor 51 is configured including a channel region 53, a gate electrode 55, source/drain regions 52, and source/drain electrodes 72. The gate electrode 55 is provided above the channel region 53. The source/drain regions 52 are each configured by a high concentration n-type semiconductor and are provided at positions on either side of the channel region 53. The source/drain electrodes 72 are connected to the source/drain regions 52. The front face of the second semiconductor layer 50 is covered by a third insulator layer 60 configured by an insulator such as $SiO_2$.

The intermediate semiconductor layer 30 configured by an n-type semiconductor is provided between the first semiconductor layer 10, formed in the photodiode 11, and the second semiconductor layer 50, formed with the circuit elements such as the transistor 51. The first insulator layer 20, configured by an insulator such as $SiO_2$, is provided between the intermediate semiconductor layer 30 and the first semiconductor layer 10. The second insulator layer 40, configured by an insulator such as $SiO_2$, is provided between the intermediate semiconductor layer 30 and the second semiconductor layer 50. A contact region 31, configured by a higher concentration n-type semiconductor than the intermediate semiconductor layer 30, is provided within the intermediate semiconductor layer 30. A contact electrode 71 is connected to the contact region 31.

Explanation follows regarding a manufacturing method of the semiconductor device 100. FIG. 2A to FIG. 2C, FIG. 3A to FIG. 3C, and FIG. 4A to FIG. 4C are cross-sectional views illustrating a manufacturing method of the semiconductor device 100.

First, the Double-Silicon On Insulator (Double-SOI) substrate 1 is prepared by sequentially stacking the first semiconductor layer 10 configured by an n-type semiconductor, the first insulator layer 20, the intermediate semiconductor layer 30 configured by an n-type semiconductor, the second insulator layer 40, and the second semiconductor layer 50 configured by a p-type semiconductor (FIG. 2A).

Figure 2B:
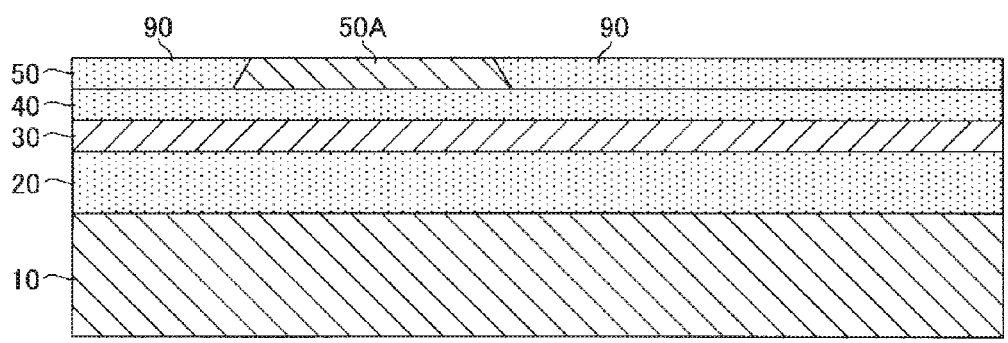
FIG. 2B is a cross-sectional view illustrating a manufacturing method of a semiconductor device according to an exemplary embodiment of the present disclosure.

Next, a field oxide film 90 is formed in the second semiconductor layer 50 by a Local Oxidation of Silicon (LOCOS) method. The area of the second semiconductor layer 50 where the field oxide film 90 is not formed becomes an active region 50A where the circuit elements such as the transistor are formed (FIG. 2B).

Figure 2C:
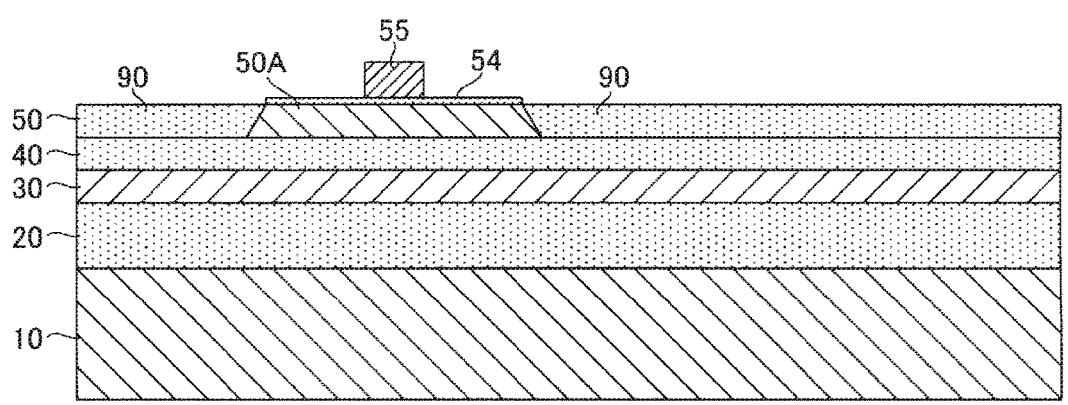
FIG. 2C is a cross-sectional view illustrating a manufacturing method of a semiconductor device according to an exemplary embodiment of the present disclosure.

Next, a gate oxide film 54 and a polysilicon film are deposited above the active region 50A of the second semiconductor layer 50. The gate electrode 55 is then formed by patterning the polysilicon film using photolithographic technology (FIG. 2C).

Figure 3A:
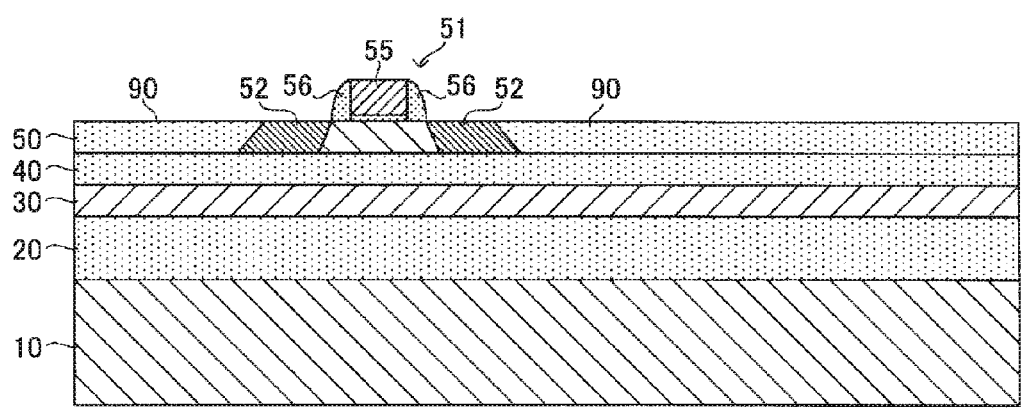
FIG. 3A is a cross-sectional view illustrating a manufacturing method of a semiconductor device according to an exemplary embodiment of the present disclosure.

Next, side walls 56 are formed at side faces of the gate electrode 55. The source/drain regions 52, configured by high concentration n-type semiconductors at positions on either side of the gate electrode 55, are then formed by implanting a dopant including a group 15 element, such as phosphorus or arsenic, into the active region 50A of the second semiconductor layer 50 using an ion-implantation method. The transistor 51 is formed in this manner (FIG. 3A).

Figure 3B:
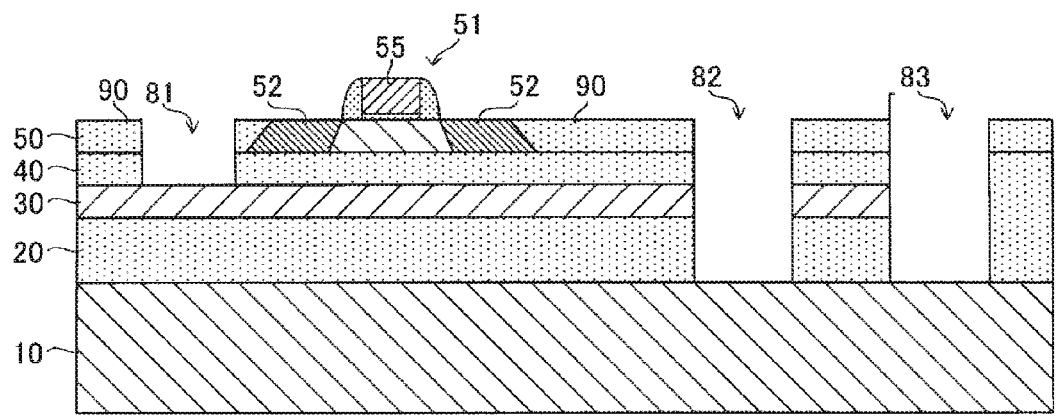
FIG. 3B is a cross-sectional view illustrating a manufacturing method of a semiconductor device according to an exemplary embodiment of the present disclosure.

Next, the second semiconductor layer 50 (field oxide film 90) and the second insulator layer 40 are etched through by dry etching to form an opening 81 down to the intermediate semiconductor layer 30. The second semiconductor layer 50 (field oxide film 90), the second insulator layer 40, the intermediate semiconductor layer 30, and the first insulator layer 20 are also etched through by dry etching to form openings 82 and 83 down to the first semiconductor layer 10 (FIG. 3B).

Figure 3C:
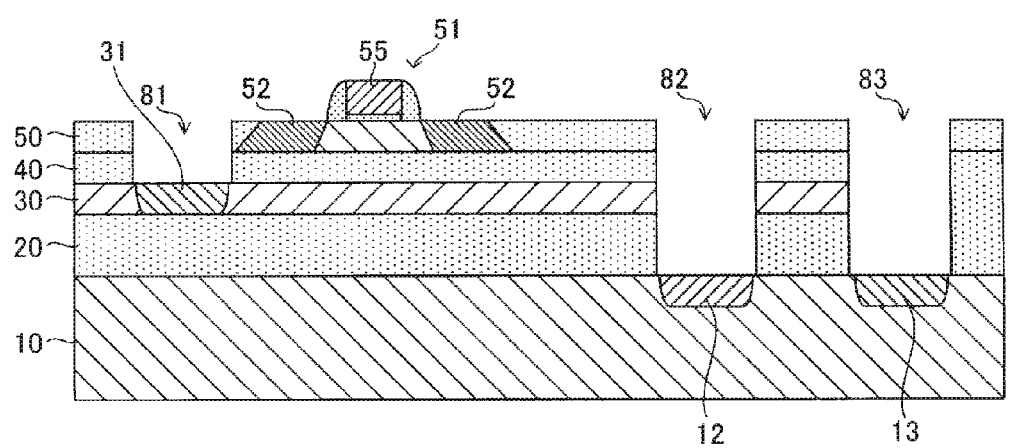
FIG. 3C is a cross-sectional view illustrating a manufacturing method of a semiconductor device according to an exemplary embodiment of the present disclosure.

Next, a dopant including a group 15 element, such as phosphorus or arsenic, is implanted into the area of the first semiconductor layer 10 exposed at the opening 83 using an ion-implantation method, thereby forming the cathode 13. The cathode 13 is configured by a high concentration n-type semiconductor and is formed on the front face of the first semiconductor layer 10. A dopant including a group 13 element, such as boron, is implanted into the area of the first semiconductor layer 10 exposed by the opening 82 using an ion-implantation method, thereby forming the cathode 12. The cathode 12 is configured by a high concentration p-type semiconductor and is formed on the front face of the first semiconductor layer 10. Furthermore, a dopant including a group 15 element, such as phosphorus or arsenic, is implanted into the area of the intermediate semiconductor layer 30 exposed by the opening 81 using an ion-implantation method, thereby forming the contact region 31. The contact region 31 is configured by a high concentration n-type semiconductor, and is formed in the intermediate semiconductor layer 30 (FIG. 3C).

Figure 4A:
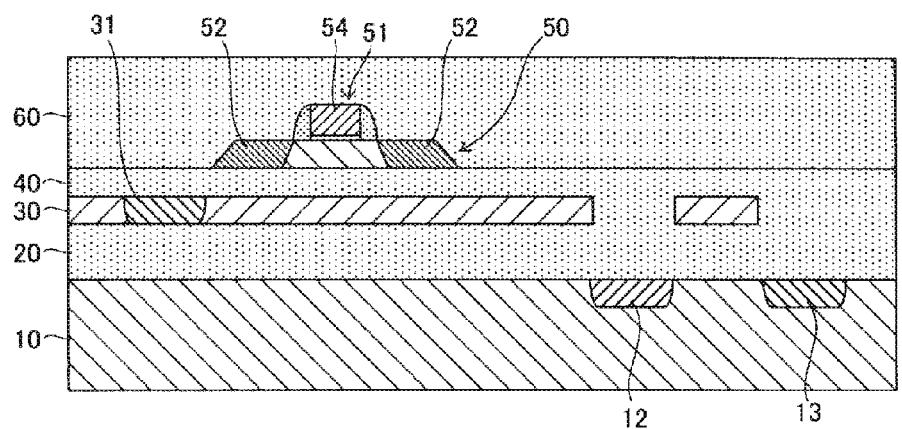
FIG. 4A is a cross-sectional view illustrating a manufacturing method of a semiconductor device according to an exemplary embodiment of the present disclosure.

Next, the third insulator layer 60, configured by an insulator such as $SiO_2$, is formed using a chemical vapor disposition (CVD) method, so as to cover the second semiconductor layer 50 formed with the circuit elements including the transistor 51. The openings 81, 82, and 83 formed in the previous processes are filled in by the third insulator layer 60 (FIG. 4A).

Figure 4B:
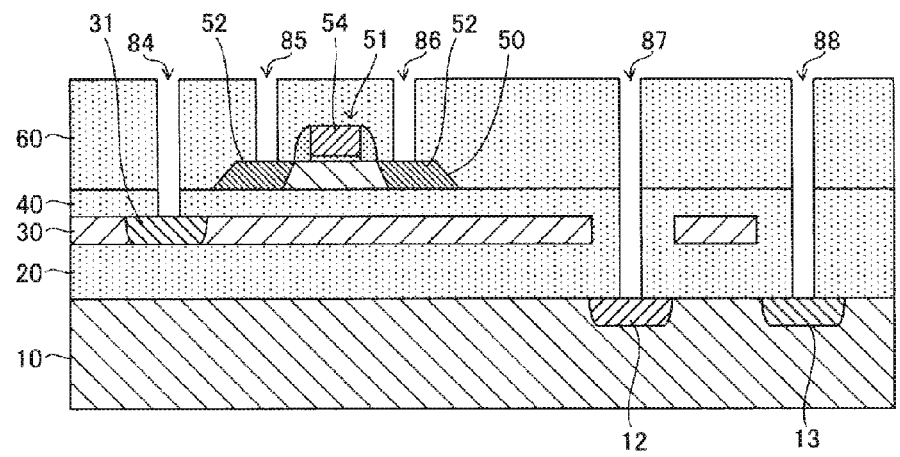
FIG. 4B is a cross-sectional view illustrating a manufacturing method of a semiconductor device according to an exemplary embodiment of the present disclosure.

Next, the third insulator layer 60, the second semiconductor layer 50, and the second insulator layer 40 are etched through by dry etching to form an opening 84 down to the contact region 31 formed in the intermediate semiconductor layer 30. The third insulator layer 60 is etched through by dry etching to form openings 85 and 86 down to the source/drain regions 52. The third insulator layer 60, the second semiconductor layer 50, the second insulator layer 40, the intermediate semiconductor layer 30, and the first insulator layer 20 are also etched through by dry etching to form openings 87 and 88 respectively down to the anode 12 and the cathode 13 formed in the first semiconductor layer 10 (FIG. 4B).

Figure 4C:
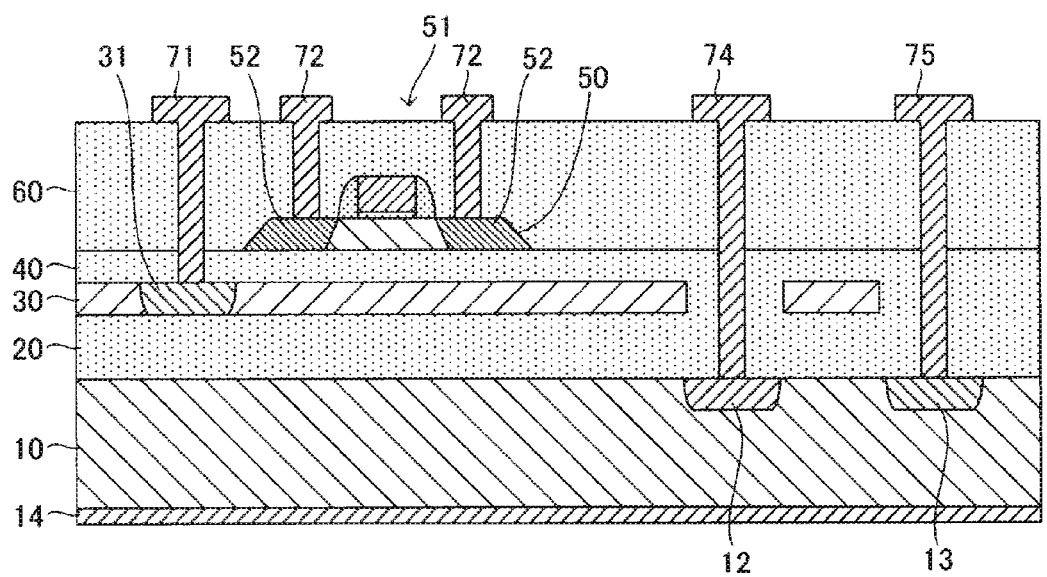
FIG. 4C is a cross-sectional view illustrating a manufacturing method of a semiconductor device according to an exemplary embodiment of the present disclosure.

Next, a metal such as aluminum is deposited on the front face of the third insulator layer 60 using a sputtering method. The openings 84, 85, 86, 87, and 88 are filled in by this metal. The metal is then patterned with a desired pattern. Thus, the contact electrode 71 connected to the contact region 31, the source/drain electrodes 72 connected to the source/drain regions 52, the anode electrode 74 connected to the anode 12, and the cathode electrode 75 connected to the cathode 13, are formed. Next, the back face electrode 14 is formed on the back face of the first semiconductor layer 10 using a sputtering method (FIG. 4C).

FIG. 1 illustrates an example of a bias method when employing the semiconductor device 100. In order to detect X-rays with the semiconductor device 100, the first semiconductor layer 10 is depleted by applying a reverse bias voltage to the photodiode 11. Namely, in order to detect X-rays with the semiconductor device 100, the back face electrode 14 and the cathode electrode 75 are connected to an anode of a power source 200, and the anode electrode 74 is connected to a ground potential-connected cathode of the power source 200. The reverse bias voltage applied to the photodiode 11 may, for example, be several hundred volts.

The intermediate semiconductor layer 30, which is configured by an n-type semiconductor interposed between the first semiconductor layer 10 and the second semiconductor layer 50, is fixed to the potential of the cathode of the power source 200 (ground potential), such that the circuit elements including the transistor 51 formed on the second semiconductor layer 50 are not unintentionally operated (erroneously operated) by the high voltage applied to the first semiconductor layer 10. Namely, in order to detect X-rays with the semiconductor device 100, the contact electrode 71 connected to the intermediate semiconductor layer 30 is connected to the ground potential-connected cathode of the power source 200.

Hereinafter, a case in which an intermediate semiconductor layer 30 is configured by a p-type semiconductor, as described in JP-A No. 2014-135454, is considered. FIG. 5 is a cross-sectional view schematically illustrating a state that would occur inside the intermediate semiconductor layer 30 in a case in which the intermediate semiconductor layer 30 is configured by a p-type semiconductor. Positive charges arising when manufacturing the semiconductor device 100 retain in the vicinity of a boundary between the intermediate semiconductor layer 30 and the first insulator layer 20 and the vicinity of a boundary between the intermediate semiconductor layer 30 and the second insulator layer 40. Thus, free electrons, these being minority carriers, are drawn toward the first insulator layer 20 side of the inside of the intermediate semiconductor layer 30, and an n-type inversion layer 32, where the conduction type of the intermediate semiconductor layer 30 (p-type) has been inverted, is formed at the first insulator layer 20 side of the inside of the intermediate semiconductor layer 30. Similarly, free electrons, these being minority carriers, are also drawn toward the second insulator layer 40 side of the inside of the intermediate semiconductor layer 30, and an n-type inversion layer 33 is formed at the second insulator layer 40 side of the inside of the intermediate semiconductor layer 30. In a case in which the inversion layer 32 and the inversion layer 33 are contiguous to each other, the potential of the intermediate semiconductor layer 30 enters a floating state not fixed to the ground potential, even in a case in which the ground potential is applied to the intermediate semiconductor layer 30 through the contact electrode 71. In a case in which capacitive coupling occurs between the intermediate semiconductor layer 30 in the floating state and the first semiconductor layer 10 applied with a high voltage occurs, a potential corresponding to the high voltage applied to the first semiconductor layer 10 is unintentionally imparted to the intermediate semiconductor layer 30. As a result, there is a concern that the circuit elements, including the transistor 51 formed in the second semiconductor layer 50, erroneously operate.

However, in the semiconductor device 100 according to the present exemplary embodiment of the present disclosure, the intermediate semiconductor layer 30 is configured by an n-type semiconductor. Thus, inversion layers do not occur inside the intermediate semiconductor layer 30, even in a case in which positive charges arising during manufacture of the semiconductor device 100 retain in the vicinity of the boundary between the intermediate semiconductor layer 30 and the first insulator layer 20, and the vicinity of the boundary between the intermediate semiconductor layer 30 and the second insulator layer 40. Thus, the potential of the intermediate semiconductor layer 30 may be reliably fixed to the ground potential by applying the ground potential to the intermediate semiconductor layer 30 through the contact electrode 71. This may enable high voltage applied to the first semiconductor layer 10 to be suppressed from influencing the operation of the circuit elements including the transistor 51 formed in the second semiconductor layer 50.

Note that, in the present exemplary embodiment, an example has been given of a case in which the intermediate semiconductor layer 30 also extends above a formation region of the photodiode 11 (namely, above the second region of the first semiconductor layer 10). However, as long as the intermediate semiconductor layer 30 extends to at least below the circuit elements including the transistor 51 formed to the second semiconductor layer 50 (above the first region of the first semiconductor layer 10), the advantageous effect of suppressing a high voltage applied to the first semiconductor layer 10 from influencing the circuit elements, may be obtained. Thus, the part of the intermediate semiconductor layer 30 that extends above the formation region of the photodiode 11 (above the second region of the first semiconductor layer 10) may be omitted.

Second Exemplary Embodiment

Figure 6:
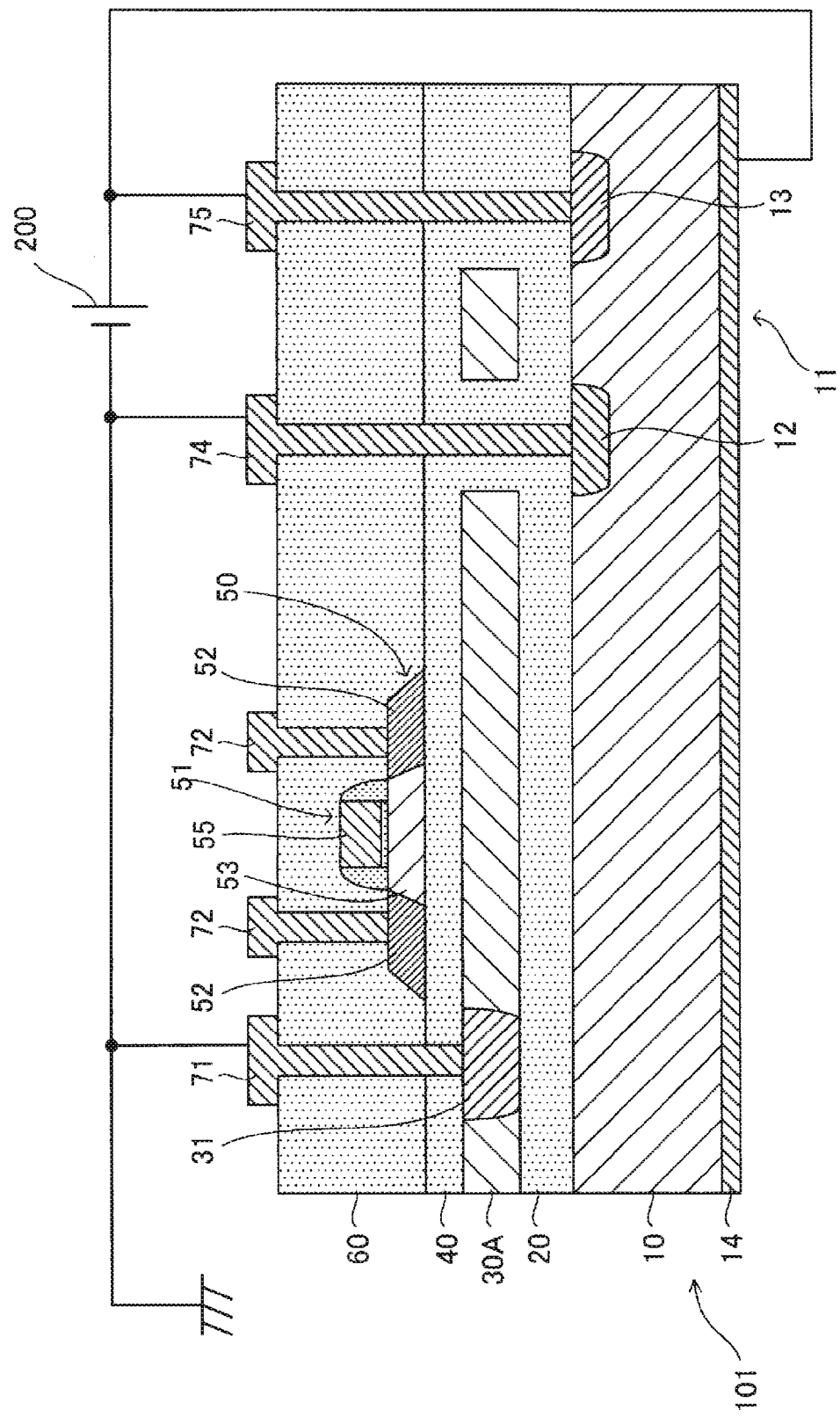
FIG. 6 is a cross-sectional view illustrating configuration of a semiconductor device according to another exemplary embodiment of the present disclosure.
Figure 7:
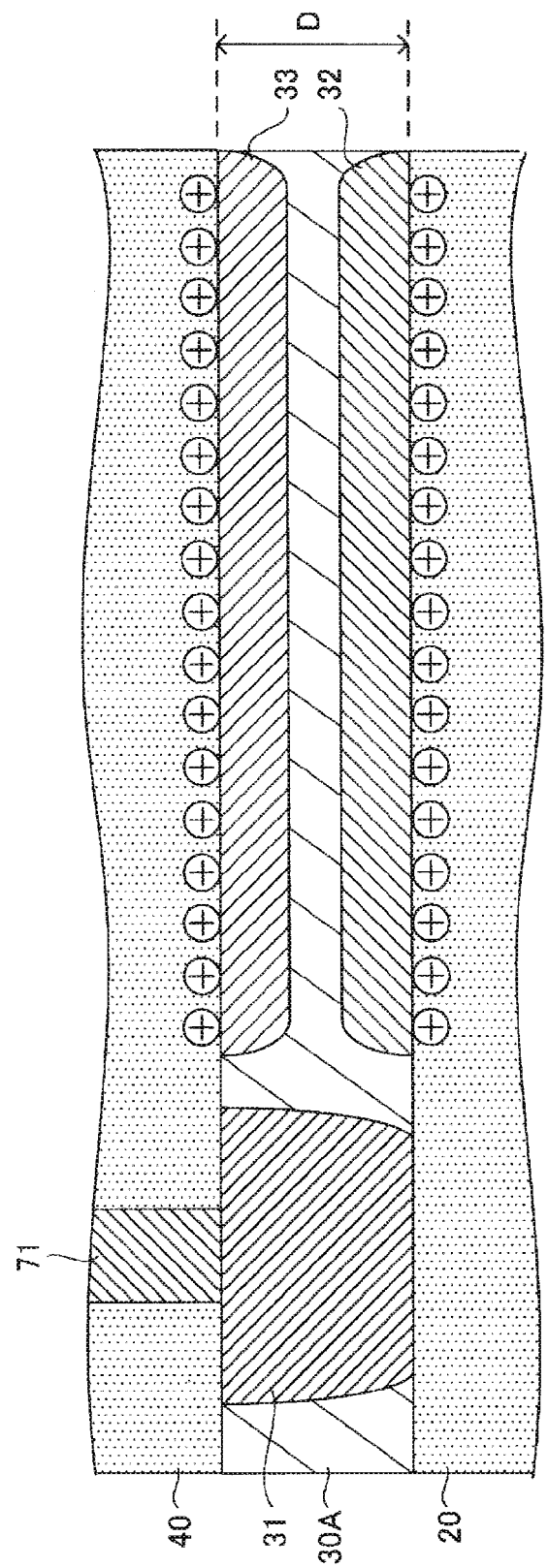
FIG. 7 is a cross-sectional view illustrating a state inside an intermediate semiconductor layer according to another exemplary embodiment of the present disclosure.

FIG. 6 is a cross-sectional view illustrating configuration of a semiconductor device 101 according to a second exemplary embodiment of the present disclosure. FIG. 7 is a cross-sectional view illustrating a state inside an intermediate semiconductor layer 30A of the semiconductor device 101.

In the semiconductor device 101, the intermediate semiconductor layer 30A is configured by a p-type semiconductor. As illustrated in FIG. 7, the intermediate semiconductor layer 30A is formed with a thickness such that an inversion layer 32 and an inversion layer 33 are not contiguous to each other. The inversion layer 32 is formed at the first insulator layer 20 side of the intermediate semiconductor layer 30A due to positive charges retaining in the vicinity of the boundary between the intermediate semiconductor layer 30A and the first insulator layer 20. The inversion layer 33 is formed at the second insulator layer 40 side of the intermediate semiconductor layer 30A due to positive charges retaining in the vicinity of the boundary between the intermediate semiconductor layer 30A and the second insulator layer 40. In the semiconductor device 101 according to the second exemplary embodiment, configuration portions other than the intermediate semiconductor layer 30A are similar to those in the semiconductor device 100 according to the first exemplary embodiment.

Figure 8:
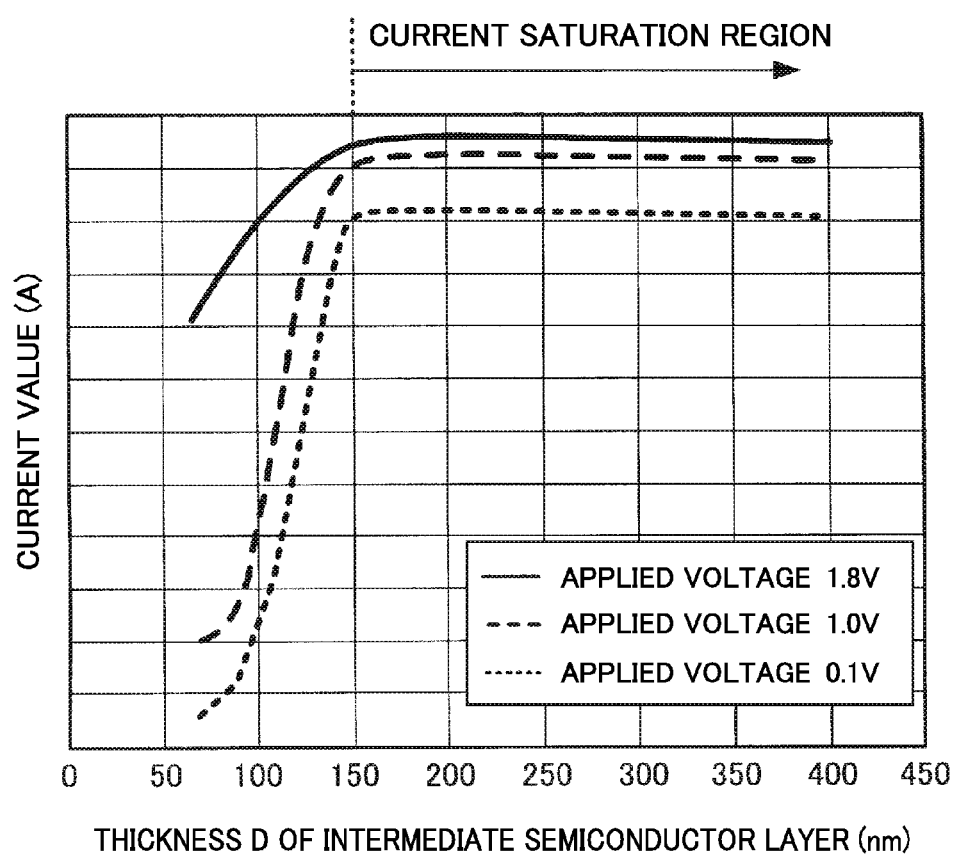
FIG. 8 is a graph plotted with values of current flowing through an intermediate semiconductor layer when thickness of the intermediate semiconductor layer and voltage applied to the intermediate semiconductor layer is changed.

FIG. 8 is a graph plotting values of current flowing through the intermediate semiconductor layer 30A when changing a thickness D of the intermediate semiconductor layer 30A and a voltage applied to the intermediate semiconductor layer 30A, in situations in which the inversion layer 32 and the inversion layer 33 are formed inside the intermediate semiconductor layer 30A as illustrated in FIG. 7.

As illustrated in FIG. 8, the thicker the thickness D of the intermediate semiconductor layer 30A, the larger the value of the current flowing through the intermediate semiconductor layer 30A. This is because the thicker the thickness D of the intermediate semiconductor layer 30A, the larger the spacing between the inversion layer 32 and the inversion layer 33, and the wider the width of the current path. Thus, by setting the thickness D of the intermediate semiconductor layer 30A at a thickness such that the inversion layer 32 and the inversion layer 33 are not contiguous to each other, the intermediate semiconductor layer 30A configured by a p-type semiconductor may be fixed to a desired potential by applying the desired potential to the contact electrode 71.

As illustrated in FIG. 8, the current value is saturated by setting the thickness D of the intermediate semiconductor layer 30A at 150 nm or greater. This indicates that the current constricting action of the inversion layer 32 and the inversion layer 33 is substantially eliminated by setting the thickness D of the intermediate semiconductor layer 30A at 150 nm or greater. Namely, by setting the thickness D of the intermediate semiconductor layer 30A at 150 nm or greater, the influence of positive charges arising when manufacturing the semiconductor device 101 is substantially eliminated, and the intermediate semiconductor layer 30A may be fixed to a desired potential by applying the desired potential to the contact electrode 71.

Third Exemplary Embodiment

Figure 9A:
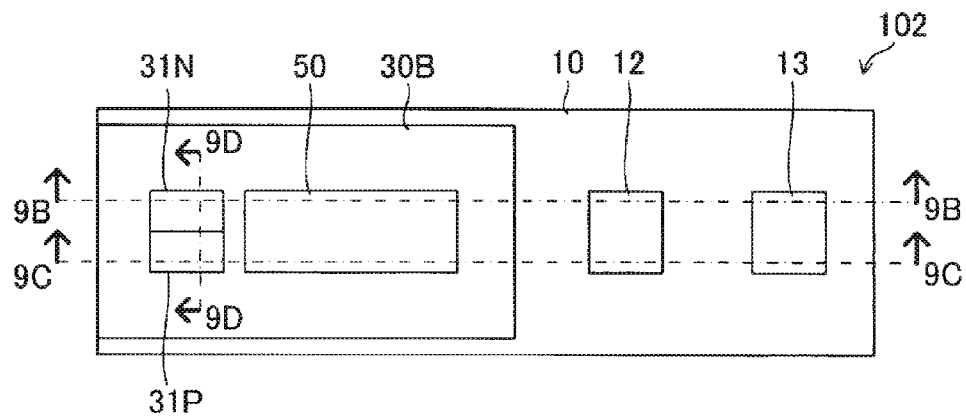
FIG. 9A is a plan view illustrating relevant portions of a semiconductor device according to another exemplary embodiment of the present disclosure.
Figure 9B:
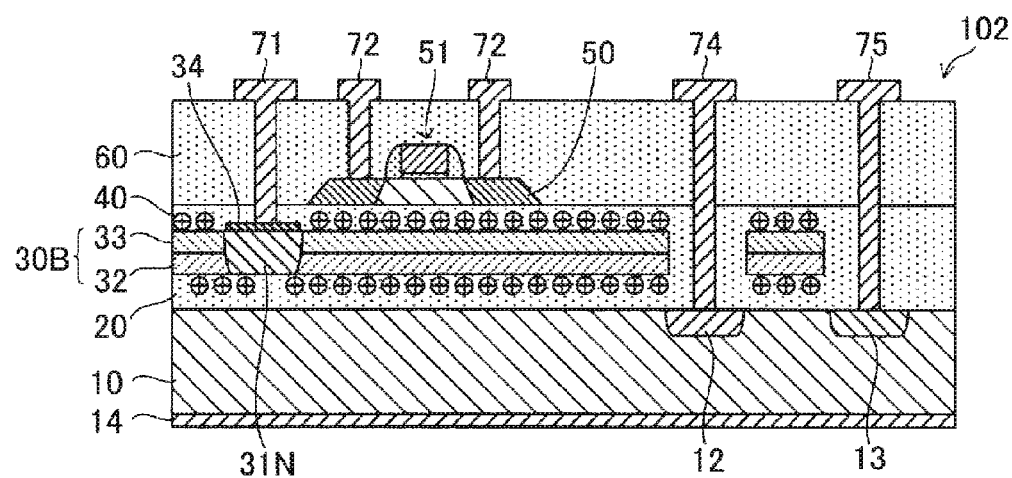
FIG. 9B is a cross-sectional view along line 9B-9B in FIG. 9A.
Figure 9C:
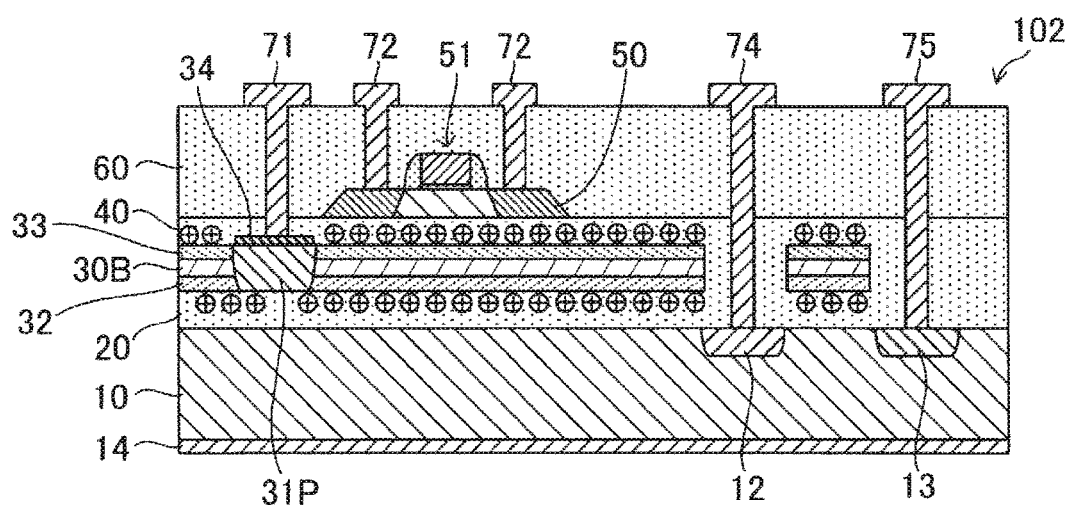
FIG. 9C is a cross-sectional view along line 9C-9C in FIG. 9A.
Figure 9D:
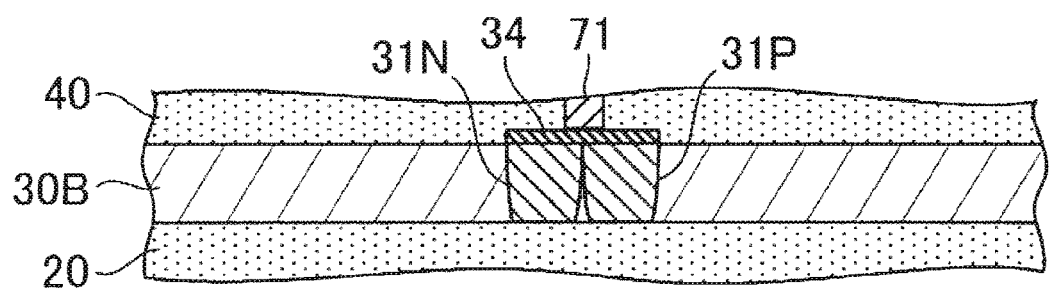
FIG. 9D is a cross-sectional view along line 9D-9D in FIG. 9A.

FIG. 9A is a plan view illustrating relevant portions of a semiconductor device 102 according to a third exemplary embodiment of the present disclosure. FIG. 9B is a cross-sectional view along line 9B-9B in FIG. 9A, FIG. 9C is a cross-sectional view along line 9C-9C in FIG. 9A, and FIG. 9D is a cross-sectional view along line 9D-9D in FIG. 9A.

In the semiconductor device 102, an intermediate semiconductor layer 30B is a p-type semiconductor. A contact region 31P configured by a p-type semiconductor and a contact region 31N configured by an n-type semiconductor are provided to the intermediate semiconductor layer 30B. As illustrated in FIG. 9A and FIG. 9D, the contact region 31P and the contact region 31N are disposed adjacent to each other. The surfaces of the contact regions 31P and 31N are covered by a common connecting electrode 34. Namely, what is referred to as a butting contact structure in which the contact region 31P and the contact region 31N, which have different conduction types to each other, are electrically connected together through the connecting electrode 34, is formed in the intermediate semiconductor layer 30B. The contact electrode 71 is connected to the connecting electrode 34. In the semiconductor device 102 according to the third exemplary embodiment, configuration portions other than the intermediate semiconductor layer 30B are similar to those in the semiconductor device 100 according to the first exemplary embodiment.

Explanation follows regarding an example of a manufacturing method of the semiconductor device 102. The circuit elements including the transistor 51 are formed in the second semiconductor layer 50 of the Double-SOI substrate by similar processes to the manufacturing method of the semiconductor device 100 according to the first exemplary embodiment. The second semiconductor layer 50 (field oxide film 90) and the second insulator layer 40 are then etched through to the intermediate semiconductor layer 30B, forming two openings (not illustrated in the drawings) for forming the contact regions 31N and 31P. Next, the contact regions 31N and 31P are formed in sequence to the intermediate semiconductor layer 30B by sequentially implanting a dopant for forming an n-type semiconductor and a dopant for forming a p-type semiconductor into the intermediate semiconductor layer 30B through the above-described openings using an ion-implantation method. Next, the connecting electrode 34, configured by an alloy layer (silicide layer) that electrically connects the contact regions 31N and 31P, is formed on the surfaces of the contact regions 31N and 31P using a salicide process. The anode 12 and the cathode 13 are then formed in the first semiconductor layer 10, after which the contact electrode 71, the source/drain electrodes 72, the anode electrode 74, the cathode electrode 75, and the back face electrode 14 are formed, by similar processes to the manufacturing processes of the semiconductor device 100 according to the first exemplary embodiment.

Note that, the contact region 31N configured by an n-type semiconductor and the cathode 13 may be formed at the same time by the same ion-implantation process, and the contact region 31P configured by a p-type semiconductor and the anode 12 may be formed at the same time by the same ion-implantation process. In the present exemplary embodiment, an example has been given in which the connecting electrode 34 that connects the contact regions 31N and 31P together is configured by an alloy layer (silicide layer) formed using a salicide process. However, the connecting electrode 34 may be a metal such as aluminum.

As illustrated in FIG. 9B, in the semiconductor device 102 according to the present exemplary embodiment, in cases in which the inversion layer 32 and the inversion layer 33 formed in the intermediate semiconductor layer 30B are contiguous to each other and substantially the entire intermediate semiconductor layer 30B becomes n-type due to positive charges retaining in the vicinity of a boundary between the intermediate semiconductor layer 30B and the first insulator layer 20, and the vicinity of a boundary between the intermediate semiconductor layer 30B and the second insulator layer 40, the potential of the intermediate semiconductor layer 30B may be fixed through the contact region 31N configured by an n-type semiconductor by applying the desired potential to the contact electrode 71. As illustrated in FIG. 9C, in cases in which the inversion layer 32 and the inversion layer 33 are not contiguous to each other and in cases in which a p-type semiconductor is interposed between the inversion layer 32 and the inversion layer 33, the potential of the intermediate semiconductor layer 30B may be fixed through the contact region 31P configured by a p-type semiconductor by applying the desired potential to the contact electrode 71. In cases in which a charge amount of positive charges charged inside the semiconductor device 102 is low, in cases in which the intermediate semiconductor layer 30B has a thick thickness, and in cases in which the concentration of impurities in the intermediate semiconductor layer 30B is relatively high, for example, it is expected that the inversion layer 32 and the inversion layer 33 will not be contiguous to each other. In cases in which inversion layers are not formed in the intermediate semiconductor layer 30B, the potential of the intermediate semiconductor layer 30B may be fixed through the contact region 31P configured by a p-type semiconductor.

In this manner, in the semiconductor device 102 according the present exemplary embodiment, the contact region 31P configured by a p-type semiconductor and the contact region 31N configured by an n-type semiconductor are provided inside the intermediate semiconductor layer 30B. This enables the intermediate semiconductor layer 30B to be fixed to a desired potential by applying the desired potential to the contact electrode 71, regardless of the state of the inversion layer 32 and the inversion layer 33 formed inside the intermediate semiconductor layer 30B. In the semiconductor device 102 according to the present exemplary embodiment, the intermediate semiconductor layer 30B may be fixed to a desired potential regardless of the state of the inversion layers 32 and 33, so that the thickness of the intermediate semiconductor layer 30B does not need to be formed with a thickness such that the inversion layers 32 and 33 are not contiguous to each other, unlike in the semiconductor device 101 according to the second exemplary embodiment.

In the above explanation, an example has been given of a case in which the intermediate semiconductor layer 30B is configured by a p-type semiconductor. However, the intermediate semiconductor layer 30B may be configured by an n-type semiconductor. Namely, in cases in which the intermediate semiconductor layer 30B is configured by an n-type semiconductor, when inversion layers formed in the intermediate semiconductor layer 30B are contiguous to each other and the entire intermediate semiconductor layer 30B becomes p-type due to negative charge retaining in the vicinity of the boundary between the intermediate semiconductor layer 30B and the first insulator layer 20, and the vicinity of the boundary between the intermediate semiconductor layer 30B and the second insulator layer 40, the potential of the intermediate semiconductor layer 30B may be fixed through the contact region 31P configured by a p-type semiconductor by applying the desired potential to the contact electrode 71. In cases in which the inversion layers are not contiguous to each other and there is an n-type semiconductor interposed between upper and lower inversion layers, the potential of the intermediate semiconductor layer 30B may be fixed through the contact region 31N configured by an n-type semiconductor by applying the desired potential to the contact electrode 71. In cases in which the inversion layers are not formed in the intermediate semiconductor layer 30B configured by an n-type semiconductor, the potential of the semiconductor layer 30B may be fixed through the contact region 31N configured by an n-type semiconductor. Thus, in the semiconductor device 102 according to the present exemplary embodiment, the intermediate semiconductor layer 30B may be fixed to a desired potential regardless of the conduction type and the thickness of the intermediate semiconductor layer 30B.

What is claimed is:

1. A semiconductor device comprising:
a first semiconductor layer including a first region and a second region;
an insulator layer provided above the first semiconductor layer;
a second semiconductor layer provided above the first region of the first semiconductor layer and above the insulator layer;
an n-type conduction region provided under the second semiconductor layer;
a sensor formed in the second region of the first semiconductor layer;
a first contact electrode connected to the n-type conduction region;
a second contact electrode connected to the second semiconductor layer, the second contact electrode being shorter than the first contact electrode;
a third contact electrode connected to the first contact electrode and the second region, the third contact electrode being longer than the second contact electrode; and
a circuit element formed in the second semiconductor layer.

2. The semiconductor device of claim 1, wherein:
the sensor includes a p-type semiconductor region and an n-type semiconductor region provided at a face at an insulator layer side of the first semiconductor layer, and a back face electrode provided at a face at an opposite side from the face at the insulator layer side of the first semiconductor layer; and
an anode of a power source is connected to the n-type semiconductor region and to the back face electrode, and a cathode of the power source is connected to the p-type semiconductor region and to the first contact electrode.

3. A semiconductor device comprising:
a first semiconductor layer including a first region and a second region;
an insulator layer provided above the first semiconductor layer;
a second semiconductor layer provided above the first region of the first semiconductor layer and above the insulator layer;
a p-type conduction region provided under the second semiconductor layer;
a sensor formed in the second region of the first semiconductor layer;
a first contact electrode connected to the p-type conduction region;
a second contact electrode connected to the second semiconductor layer, the second contact electrode being shorter than the first contact electrode;
a third contact electrode connected to the first contact electrode and the second region, the third contact electrode being longer than the second contact electrode; and
a circuit element formed in the second semiconductor layer,
wherein the p-type conduction region has a thickness such that a first inversion layer formed at an insulator layer side of the p-type conduction region and a second inversion layer formed at a second semiconductor layer side of the p-type conduction region do not contact each other.

4. The semiconductor device of claim 3, further comprising a second insulator layer provided between the p-type conduction region and the second semiconductor layer,
wherein the first inversion layer is formed due to positive charges retained at a vicinity of a boundary between the p-type conduction region and the insulator layer, and the second inversion layer is formed due to positive charges retained at a vicinity of a boundary between the p-type conduction region and the second insulator layer.

5. The semiconductor device of claim 3, wherein a thickness of the p-type conduction region is 150 nm or greater.

6. The semiconductor device of claim 3, wherein:
the sensor includes a p-type semiconductor region and an n-type semiconductor region provided at a face at an insulator layer side of the first semiconductor layer, and a back face electrode provided at a face at an opposite side from the face at the insulator layer side of the first semiconductor layer; and
an anode of a power source is connected to the n-type semiconductor region and to the back face electrode, and a cathode of the power source is connected to the p-type semiconductor region and to the first contact electrode.

* * * * *